(12) United States Patent
Kobayashi et al.

(10) Patent No.: US 12,354,898 B2
(45) Date of Patent: Jul. 8, 2025

(54) STAGE, TESTING APPARATUS, AND STAGE OPERATING METHOD

(71) Applicant: Tokyo Electron Limited, Tokyo (JP)

(72) Inventors: Masahito Kobayashi, Yamanashi (JP); Hiroto Kobayashi, Yamanashi (JP); Hiroaki Agawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 489 days.

(21) Appl. No.: 17/932,752

(22) Filed: Sep. 16, 2022

(65) Prior Publication Data

US 2023/0110797 A1 Apr. 13, 2023

(30) Foreign Application Priority Data

Sep. 30, 2021 (JP) .................................. 2021-162243
Jul. 11, 2022 (JP) .................................. 2022-111352

(51) Int. Cl.
*G01K 3/14* (2006.01)
*H01L 21/677* (2006.01)
*H01L 21/68* (2006.01)

(52) U.S. Cl.
CPC .. *H01L 21/67742* (2013.01); *H01L 21/67766* (2013.01); *H01L 21/68* (2013.01)

(58) Field of Classification Search
CPC ......... H01L 21/67742; H01L 21/67766; H01L 21/68; G12B 5/00
See application file for complete search history.

(56) References Cited

U.S. PATENT DOCUMENTS 4,950,982 A * 8/1990 Obikane ............ G01R 31/2831
198/395

FOREIGN PATENT DOCUMENTS

| JP | 2000-260852 | 9/2000 |
| JP | 2015-170627 | 9/2015 |
| JP | 2021-141708 | 9/2021 |
| KR | 10-2001-0112838 | 12/2001 |
| KR | 10-2005-0004293 | 1/2005 |
| KR | 10-2017-0093365 | 8/2017 |

* cited by examiner

*Primary Examiner* — Muhammad S Islam
(74) *Attorney, Agent, or Firm* — IPUSA, PLLC

(57) ABSTRACT

A stage includes a base on which an object to be transported or tested is placed, four movable bodies configured to support the base in a manner so that the base can be raised and lowered, four driving motors, provided in correspondence with the four movable bodies, and configured to independently raise and lower the four movable bodies, respectively, four guides configured to guide the four movable bodies, respectively, and a support frame, having wall surfaces parallel to a raising and lowering direction of the base and continuous along a direction perpendicular to the raising and lowering direction of the base, and the four guides fixed to the wall surfaces.

17 Claims, 13 Drawing Sheets

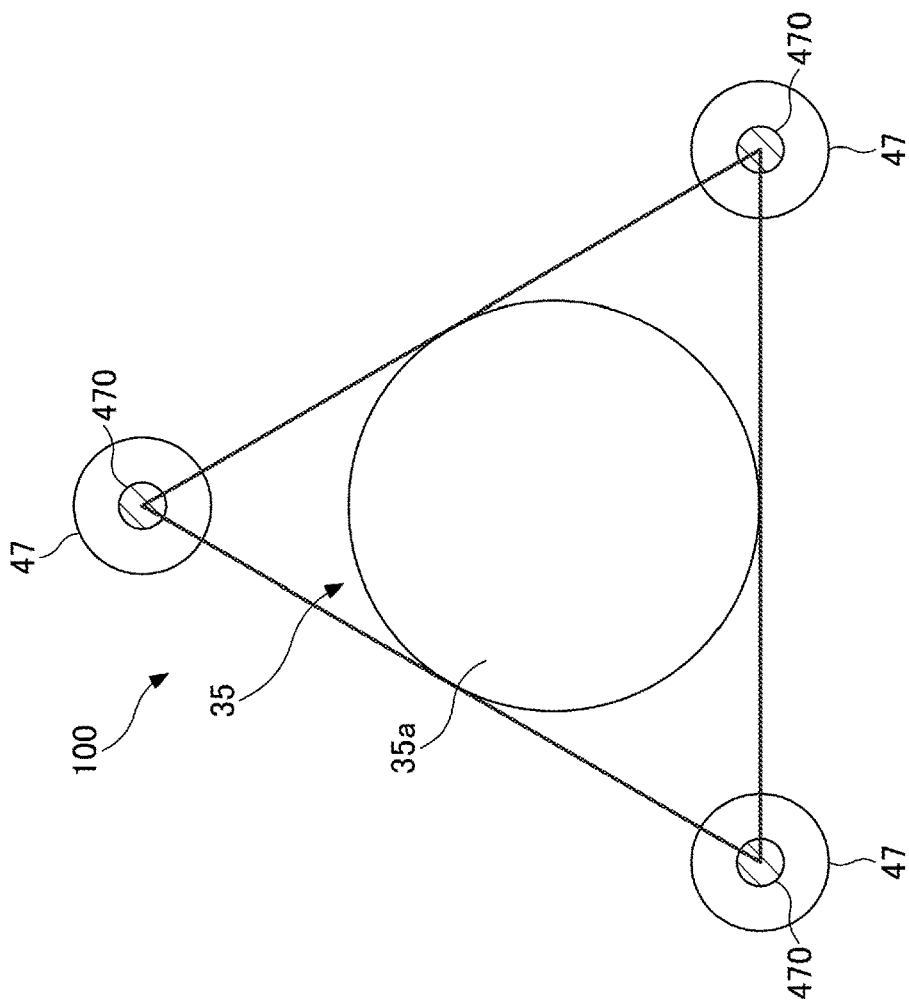
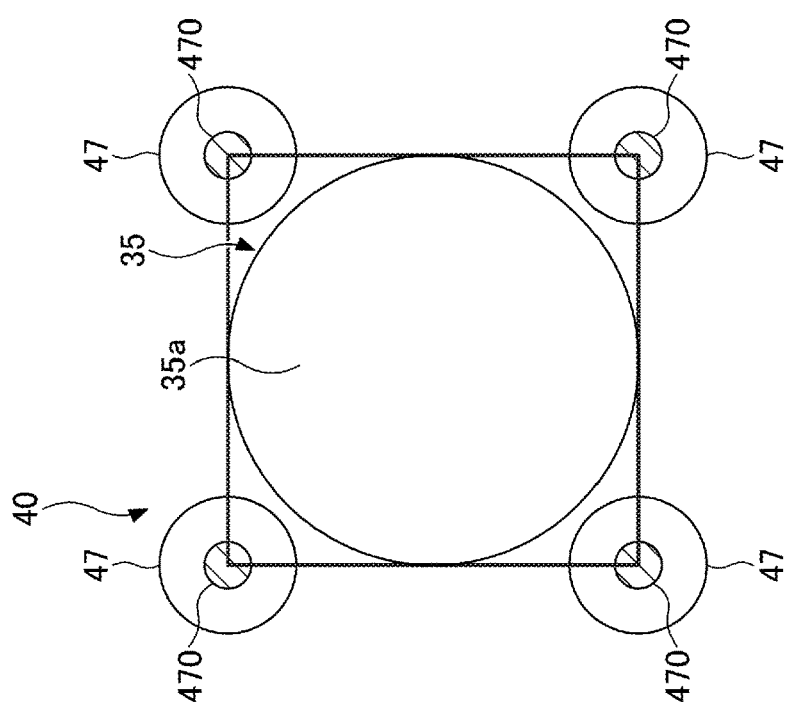

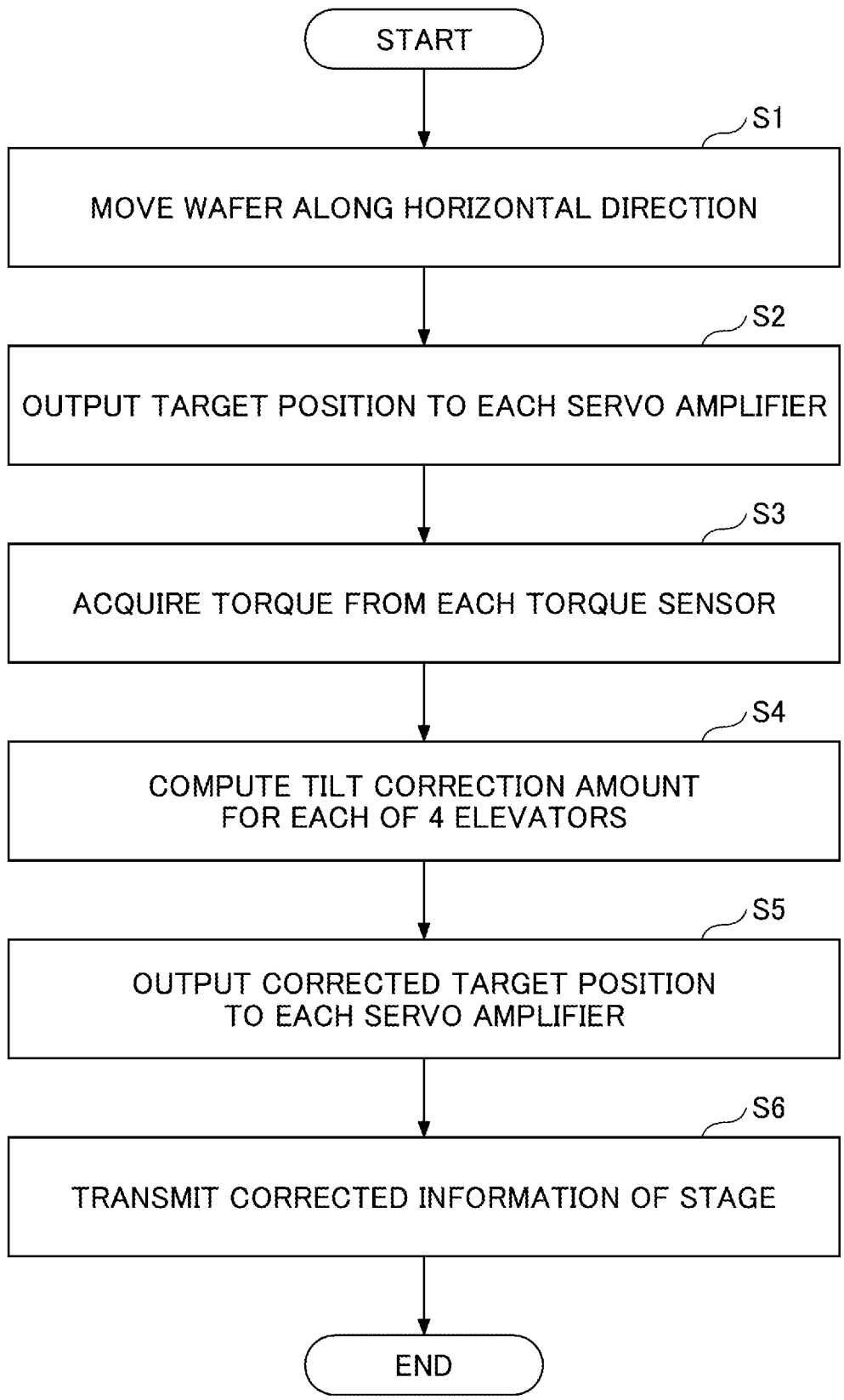

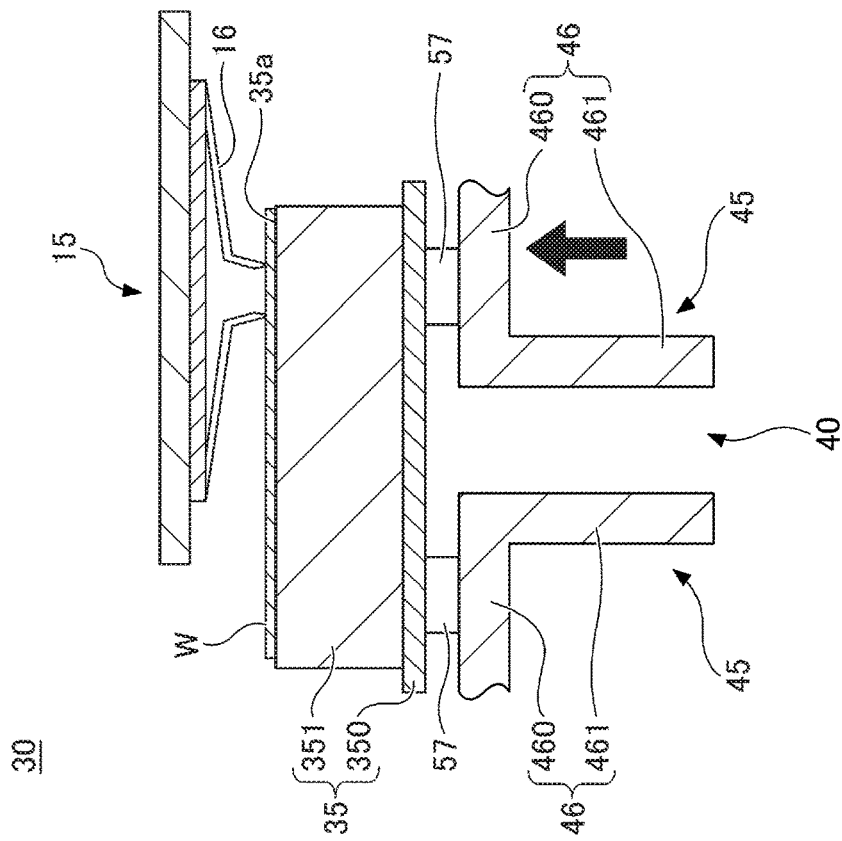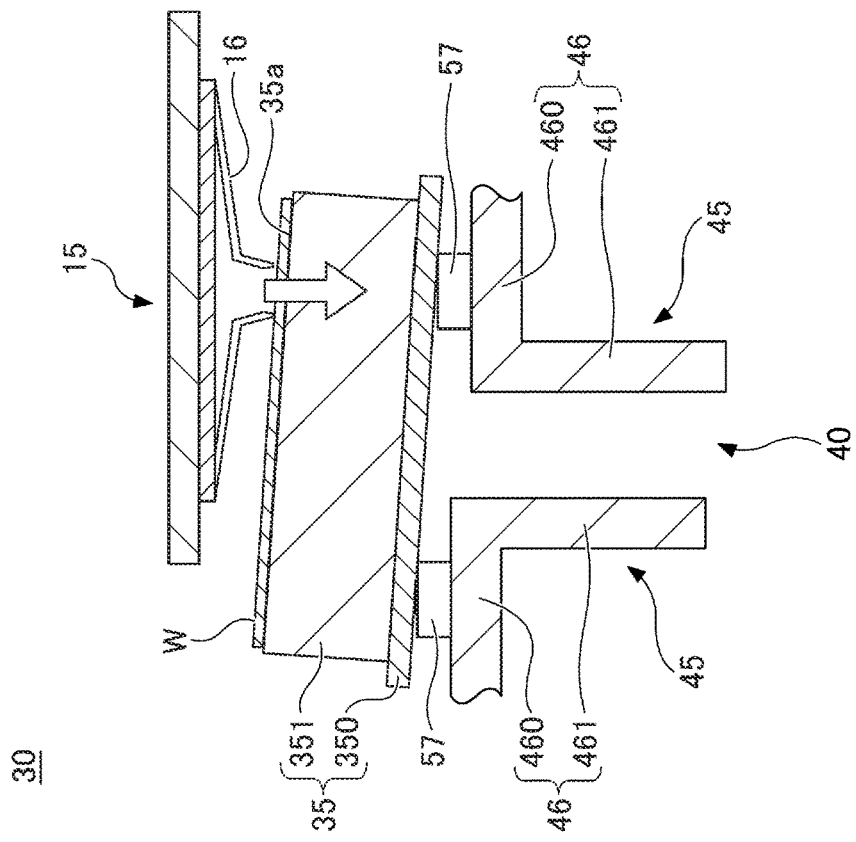

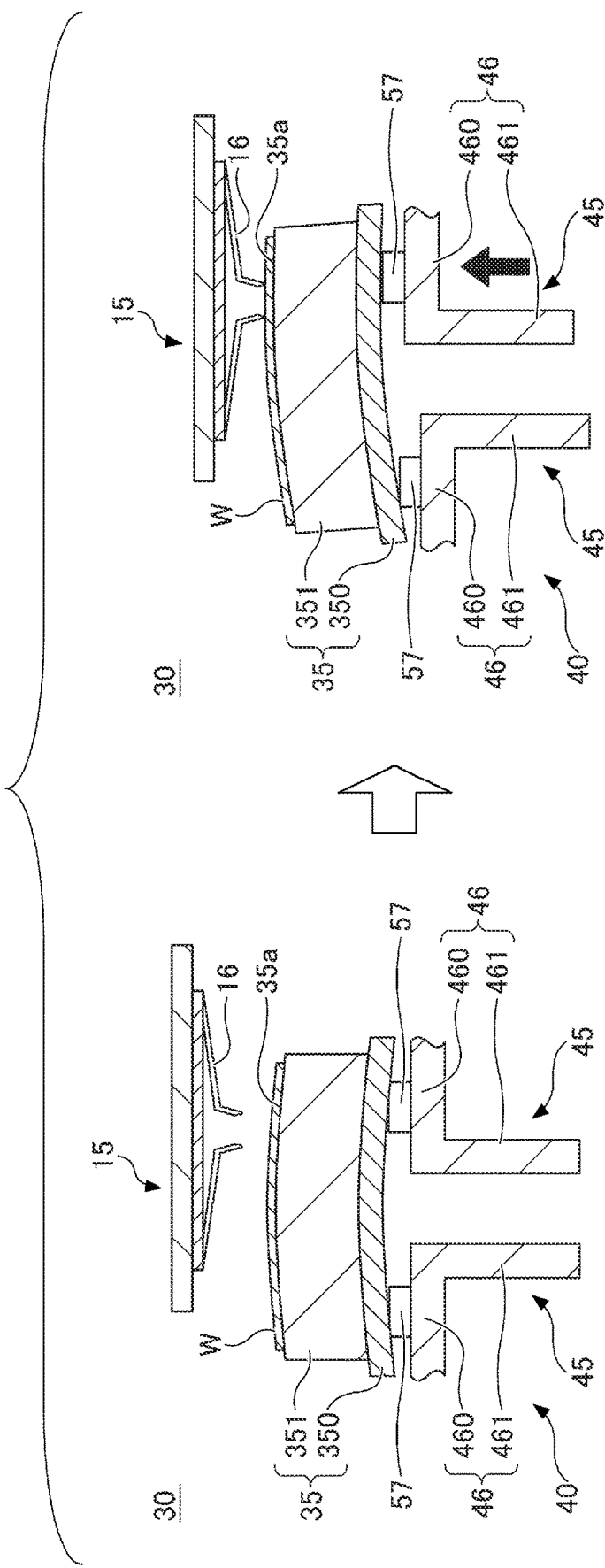

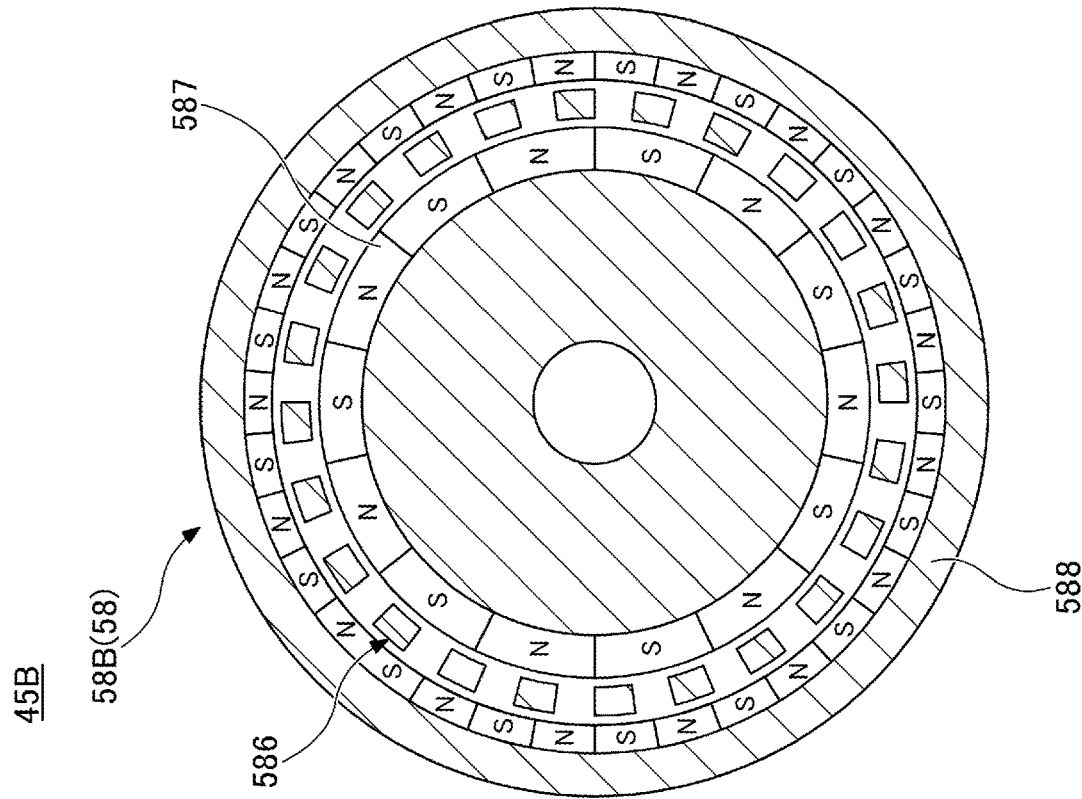
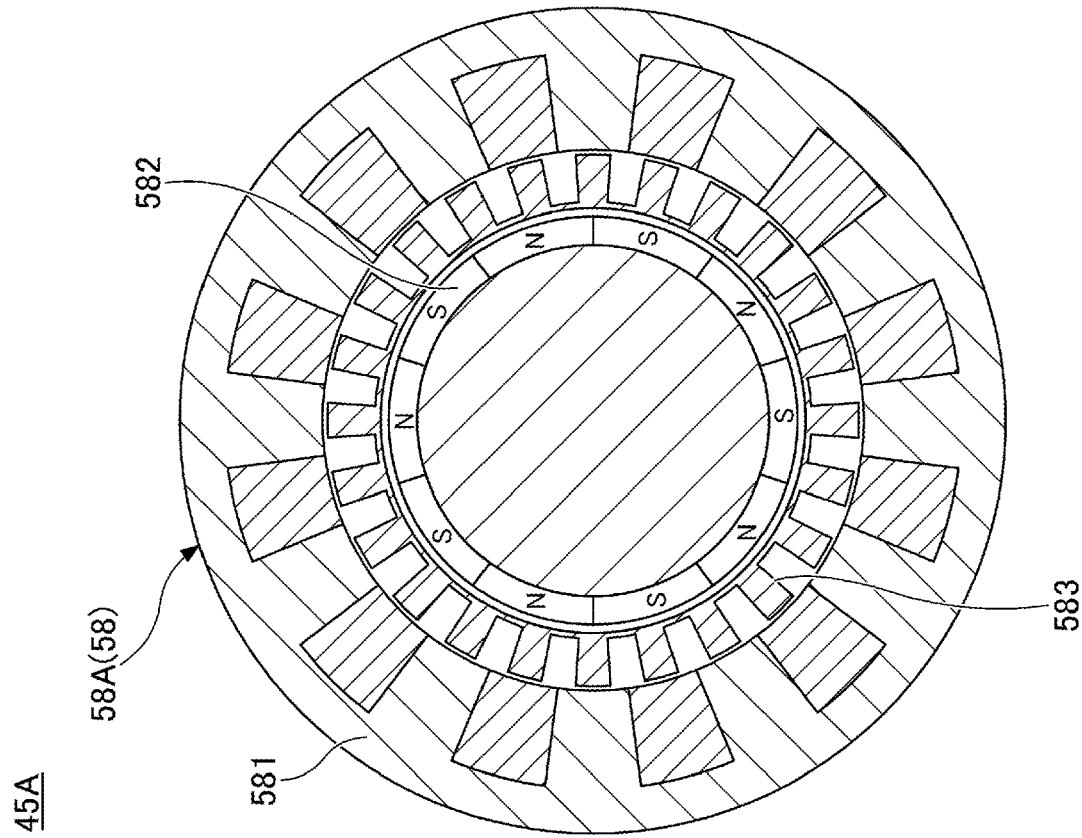

STAGE, TESTING APPARATUS, AND STAGE OPERATING METHOD

CROSS-REFERENCE TO RELATED APPLICATIONS

This application is based upon and claims priority to Japanese Patent Applications No. 2021-162243, filed on Sep. 30, 2021, and No. 2022-111352, filed on Jul. 11, 2022, the entire contents of which are incorporated herein by reference.

BACKGROUND

1. Field of the Invention

The present disclosure relates to stages, testing apparatuses, and stage operating methods.

2. Description of the Related Art

As an example, Japanese Laid-Open Patent Publication No. 2000-260852 proposes a stage (or test stage) for transporting an object to be tested to a predetermined position in a testing apparatus for testing a wafer. This proposed stage supports a single base (or placing base) on which a wafer is placed, using three elevator driving mechanisms, and raises and lowers the base while monitoring raised and lowered positions of the three elevator driving mechanisms.

When testing the wafer, the testing apparatus causes a large number (for example, several ten-thousands) of contact probes to make contact with the wafer. For this reason, a large load is applied to the base from the large number of contact probes.

SUMMARY

One aspect of embodiments of the present disclosure provides a technique that can promote equalization of the load applied to the base of the stage by suitably adjusting an attitude of the base.

A stage according to one aspect of the embodiments of the present disclosure includes a base on which an object to be transported or tested is placed; four movable bodies configured to support the base in a manner so that the base can be raised and lowered; four driving motors, provided in correspondence with the four movable bodies, and configured to independently raise and lower the four movable bodies, respectively; four guides configured to guide the four movable bodies, respectively; and a support frame, having wall surfaces parallel to a raising and lowering direction of the base and continuous along a direction perpendicular to the raising and lowering direction of the base, and the four guides fixed to the wall surfaces.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWINGS

FIG. 7A and FIG. 7B are diagrams schematically illustrating an arrangement example of an elevator of the Z-axis moving mechanism;

FIG. 8 is a flow chart for explaining an operation of the stage when testing a wafer;

FIG. 9A and FIG. 9B are diagrams illustrating an operation of a base by the stage with respect to loads of contact probes;

FIG. 10A is a diagram schematically illustrating a placing surface correction by the stage;

FIG. 12A is a diagram schematically illustrating a magnetic geared motor applied to the driving motor according to a modification; and FIG. 12B is a diagram schematically illustrating a magnetic reduction gear mechanism applied between the driving motor and a Z-axis movable body according to a modification.

DETAILED DESCRIPTION

Figure 1:
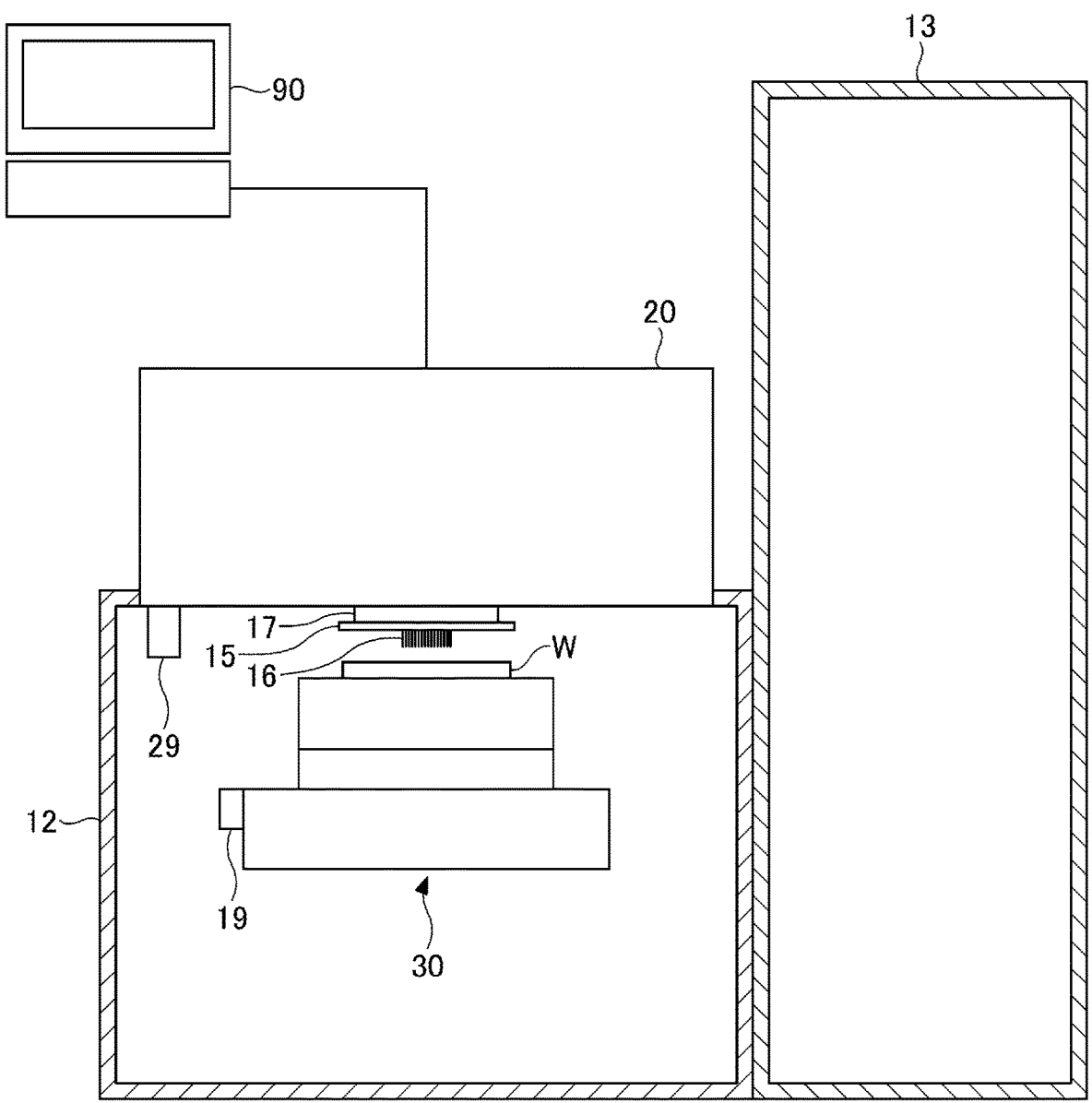
FIG. 1 is a cross sectional view schematically illustrating a testing apparatus having a stage according to one embodiment.

The present disclosure provides a technique that can promote equalization of the load applied to a base of a stage by suitably adjusting an attitude of the base.

Hereinafter, non-limiting embodiments and modifications of the present disclosure will be described with reference to the accompanying drawings. In all the accompanying drawings, the same or corresponding members or parts are designated by the same or corresponding reference numerals, and a repeated description of the same or corresponding members or parts will be omitted.

FIG. 1 is a cross sectional view schematically illustrating a testing apparatus 1 having a stage 30 according to one embodiment. As illustrated in FIG. 1, the testing apparatus 1 according to one embodiment is an apparatus for testing electrical characteristics of each semiconductor device (object to be tested or Device Under Test (DUT)) of a plurality of semiconductor devices formed on a wafer (or substrate) W. The substrate having the object to be tested is not limited to the wafer W, and may include a carrier, a glass substrate, a single chip, or the like having the plurality of semiconductor devices formed thereon. The testing apparatus 1 includes an accommodating chamber 12 for accommodating a stage 30, a loader 13 disposed adjacent to the accommodating chamber 12, and a tester 20 disposed above the accommodating chamber 12.

The accommodating chamber 12 has a box shape that is hollow inside. The stage 30 on which the wafer W is placed, a probe card 15 disposed to oppose the stage 30, and a test camera 29 for capturing an image the wafer W on the stage 30 are accommodated inside the accommodating chamber 12. The probe card 15 includes a large number of needle shaped probes (or contact terminals) 16 disposed in correspondence with electrode pads or solder bumps that are provided on electrodes of each semiconductor device on the wafer W. The test camera 29 captures a tilt of the stage 30, a position of the wafer W placed on the stage 30, or the like.

The loader 13 extracts the wafer W from a transport container (not illustrated), such as a Front Opening Universal Pod (FOUP), and places the wafer W onto the stage 30 inside the accommodating chamber 12. In addition, the loader 13 extracts the tested wafer W from the stage 30, and accommodates the tested wafer W into the FOUP.

The probe card 15 is connected to the tester 20 via an interface 17. Each probe 16 makes contact with the electrode pad or the solder bump that is provided on the electrode of each semiconductor device on the wafer W. For this reason, each probe 16 supplies power from tester 20 to the semiconductor device via the interface 17, or transmits a signal from the semiconductor device to the tester 20 via the interface 17.

The tester 20 includes a test board (not illustrated) that reproduces a portion of a circuit configuration of a mother board on which the semiconductor device is mounted. The test board is connected to a controller 90 that performs a control, and determines whether the semiconductor device is good or defective based on the signal from the semiconductor device. The tester 20 can reproduce circuit configurations of a plurality of kinds of mother boards by changing the test board.

The stage 30 transports the wafer W between the loader 13 and a position opposing the probe card 15. In addition, the stage 30 also raises the wafer W toward probe card 15 when performing the test, and lowers the wafer W after performing the test. Further, a stage camera 19 for checking the position of probe card 15 is disposed on the stage 30.

Figure 2:
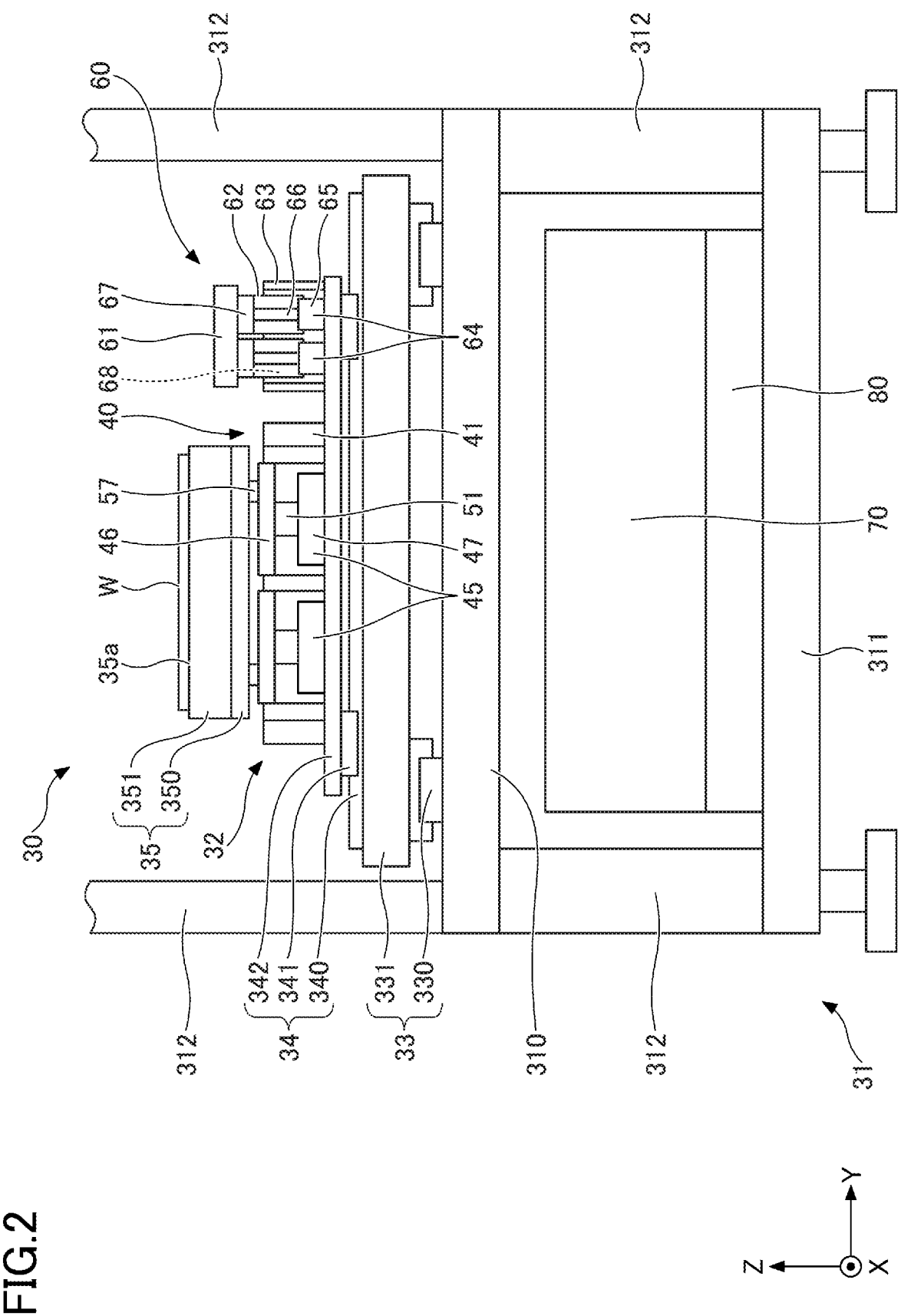
FIG. 2 is a side view schematically illustrating the stage of the testing apparatus.

FIG. 2 is a side view schematically illustrating the stage 30 of the testing apparatus 1. As illustrated in FIG. 2, the testing apparatus 1 includes a frame structure 31 for supporting the stage 30. The stage 30 provided on the frame structure 31 transports the wafer W to an appropriate three-dimensional position (in an X-axis direction, a Y-axis direction, and a Z-axis direction) inside the accommodating chamber 12. The stage 30 includes a moving part 32 (an X-axis moving mechanism 33, a Y-axis moving mechanism 34, and a Z-axis moving mechanism 40), a base 35, a needle polishing mechanism 60, a stage controller 70, and a motor driver 80.

The frame structure 31 has a two-stage structure including an upper base 310 for supporting the moving part 32, a lower base 311 for supporting the stage controller 70 and the motor driver 80, and a plurality of struts 312 provided at four corners of the upper base 310 and the lower base 311.

The X-axis moving mechanism 33 of the moving part 32 includes a plurality of guide rails 330 fixed to an upper surface of an upper base 310 and extending along the X-axis direction, and an X-axis movable body 331 disposed between the guide rails 330. The X-axis movable body 331 includes therein an X-axis operating part (a motor, a gear mechanism, or the like, not illustrated), and this X-axis operating part is connected to the motor driver 80. Hence, the X-axis movable body 331 reciprocates in the X-axis direction based on the power supplied from the motor driver 80.

Similarly, the Y-axis moving mechanism 34 includes a plurality of guide rails 340 fixed to an upper surface of the X-axis movable body 331 and extending along the Y-axis direction, and a Y-axis movable body 341 disposed between the guide rails 340. The Y-axis movable body 341 is provided with a horizontal moving table 342 having a rectangular shape in a plan view. The Y-axis movable body 341 also includes a Y-axis operating part (a motor, a gear mechanism, or the like, not illustrated), and this Y-axis operating part is connected to the motor driver 80. Thus, the Y-axis movable body 341 reciprocates in the Y-axis direction based on the power supplied from the motor driver 80.

The Z-axis moving mechanism 40 is provided on the horizontal moving table 342 (or Y-axis movable body 341), and holds the base 35 on top thereof. The Z-axis moving mechanism 40 forms an elevator mechanism according to the present embodiment that raises and lowers the wafer W placed on the base 35, by displacing the base 35 in the Z-axis direction (or a vertical direction). A configuration of the Z-axis moving mechanism 40 will be described later in more detail.

The base 35 transported by the moving part 32 described above functions as a chuck for holding the wafer W on an upper surface thereof by a suitable holding means (a vacuum chuck, a mechanical chuck, or the like). The base 35 includes a bottom plate 350 that engages the Z-axis moving mechanism 40, and a chuck top 351 that is stacked on top of the bottom plate 350.

The bottom plate 350 is formed to a suitable planar shape (for example, a generally polygonal shape) engageable with the Z-axis moving mechanism 40. The chuck top 351 is formed to a circular shape in the plan view, and is configured to be thicker than the bottom plate 350. An upper surface of the chuck top 351 forms a placing surface 35$a$ where the wafer W is placed. The base 35 may be configured to include a temperature control mechanism for adjusting a temperature of the placing surface 35$a$, a temperature sensor (not illustrated) for detecting the temperature of the placing surface 35$a$, a suction mechanism (not illustrated) for holding the wafer W placed on the placing surface 35$a$ by vacuum suction, or the like.

The needle polishing mechanism 60 of the stage 30 is provided at a position adjacent to the Z-axis moving mechanism 40 on the horizontal moving table 342. A polishing body 61 for polishing the probes 16 projecting downward from the probe card 15 is provided on top of the needle polishing mechanism 60. The needle polishing mechanism 60 includes a polishing side Z-axis moving mechanism 62 that displaces the polishing body 61 in the Z-axis direction. The polishing side Z-axis moving mechanism 62 has a configuration that is substantially the same as the configuration of the Z-axis moving mechanism 40 of the base 35.

The stage controller 70 is connected to the controller 90 of the testing apparatus 1, and controls the operation of the stage 30 based on a command from the controller 90. The stage controller 70 includes a main controller for controlling the operation of the entire stage 30, a Programmable Logic Controller (PLC, not illustrated) for controlling the operation of the moving part 32, a temperature controller (not illustrated) for controlling the temperature control mechanism, an illumination controller (not illustrated), a power supply unit (not illustrated), or the like, for example. A board (not illustrated) having a built-in computer for the stage, including one or more processors, a memory, an input-output interface, an electronic circuit, or the like, may be used for the main controller of the stage controller 70. The one or more processors include one of or a combination of two or more selected from a Central Processing Unit (CPU), an Application Specific Integrated Circuit (ASIC), a Field Programmable Gate Array (FPGA), a circuit having a plurality of discrete semiconductor devices, or the like. The one or more processors execute one or more programs stored in the memory, so as to perform one or more processes according to one or more recipes stored in the memory. The memory includes a non-volatile memory and a volatile memory, and forms a storage of the stage controller 70.

After receiving the wafer W from the loader 13 onto the base 35 of the stage 30, the stage controller 70 moves the moving part 32 in a horizontal direction (X-axis-Y-axis direction), so as to align the position of the wafer W to a position opposing the probe card 15 of a predetermined tester 20. After the position alignment, the stage controller 70 raises the base 35 by the stage 30, so that the wafer W makes contact with the probes 16 of the probe card 15. In this state, the controller 90 of the testing apparatus 1 starts an electrical test by the tester 20. In addition, after the electrical test by the tester 20 ends, the stage controller 70 lowers and horizontally moves the tested wafer W, so as to return the wafer W to the loader 13, by performing an operation in reverse to the operation at the time of performing the electrical test.

Figure 3:
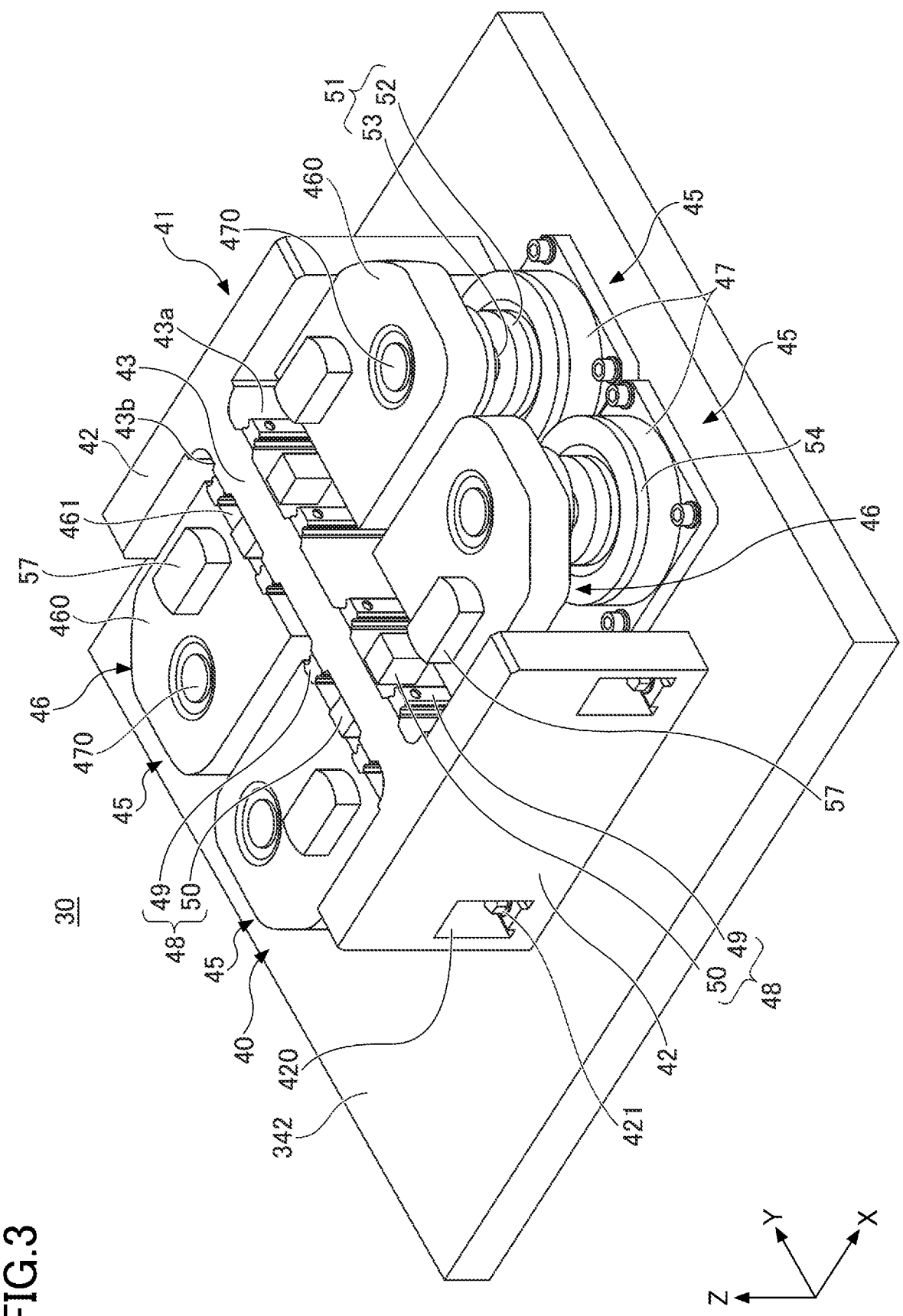
FIG. 3 is a perspective view, on an enlarged scale, illustrating a Z-axis moving mechanism of the stage.

FIG. 3 is a perspective view illustrating the Z-axis moving mechanism 40 of the stage 30 on an enlarged scale. As illustrated in FIG. 3, the Z-axis moving mechanism 40 includes a support frame 41 provided on the horizontal moving table 342. The support frame 41 is formed by a series of members continuous along a direction (the horizontal direction: X-axis-Y-axis direction) perpendicular to the raising and lowering direction of the base 35. The term "a series of members continuous along a direction perpendicular to the raising and lowering direction" means that the support frame 41 is continuous without being separated, and has a predetermined shape in the plan view. The support frame 41 protects the four elevators 45 of the Z-axis moving mechanism 40, and guides the raising and lowering of the four elevators 45. In other words, the Z-axis moving mechanism 40 is configured to raise and lower the base 35 (chuck, refer also to FIG. 1) described above by the four elevators 45.

Each elevator 45 includes a Z-axis movable body 46 for directly supporting the base 35, a driving motor (or drive motor) 47 for raising and lowering the Z-axis movable body 46, and a guide 48 for guiding the raising and lowering of the Z-axis movable body 46. In other words, the Z-axis moving mechanism 40 is configured to include a support frame 41, four Z-axis moving bodies 46, four driving motors 47, and four guides 48.

Figure 4:
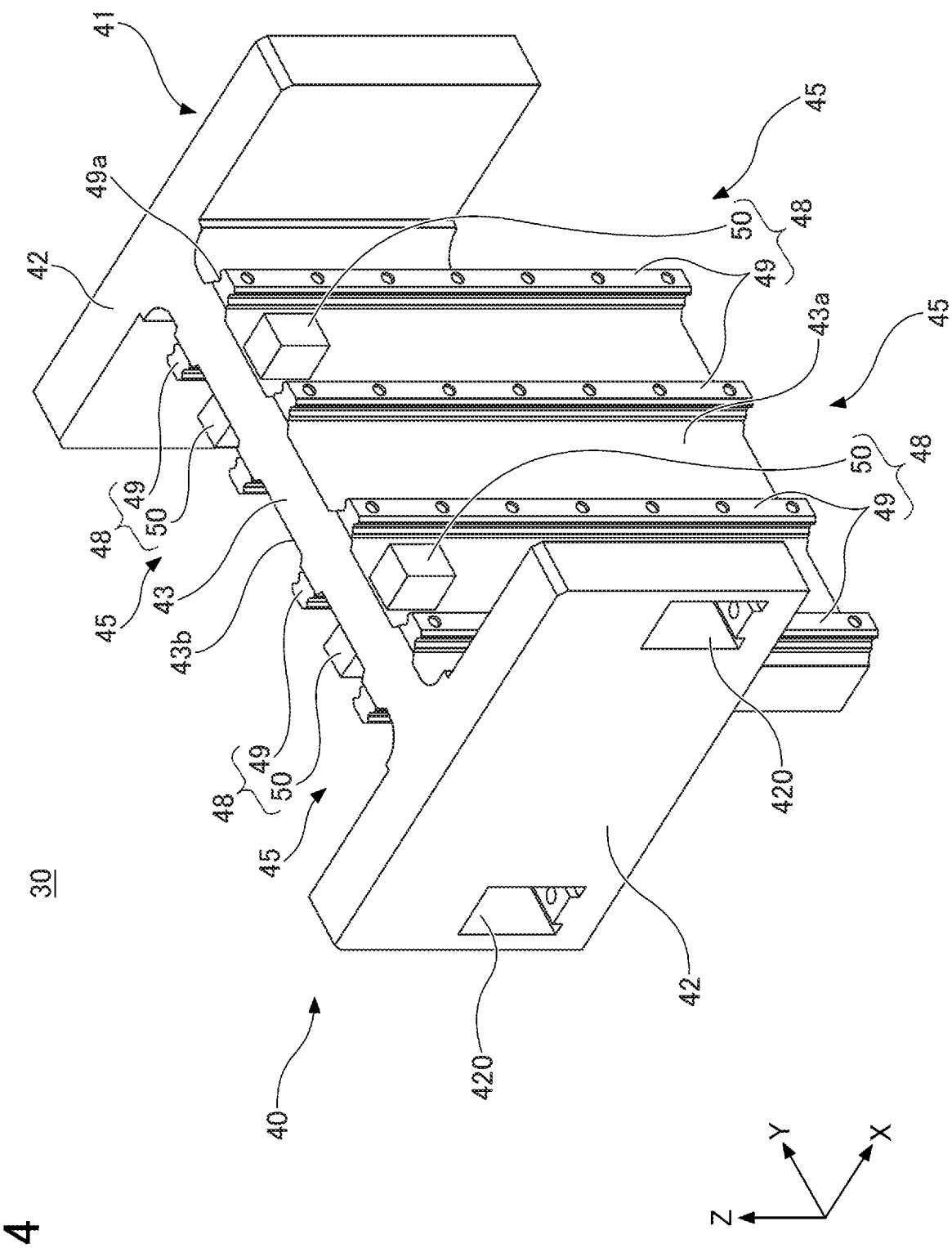
FIG. 4 is a perspective view illustrating a support frame of the Z-axis moving mechanism.

FIG. 4 is a perspective view illustrating the support frame 41 of the Z-axis moving mechanism 40. As illustrated in FIG. 4, the support frame 41 includes a pair of sidewalls 42, and a connecting wall 43 extending between the pair of sidewalls 42. The support frame is formed to an H-shape in the plan view. An upper surface of the pair of sidewalls 42, and an upper surface of the connecting wall 43 coincide and are continuous with each other, so that an upper portion of the support frame 41 is formed to a flat shape. At a lower portion of the support frame 41, a large portion of a lower portion of the connecting wall 43 projects downward with respect to a lower surface of the pair of sidewalls 42, and has a stepped shape. In a state where the support frame 41 is fixed to the horizontal moving table 342, the connecting wall 43 is inserted into a hole 342a (refer to FIG. 5) formed in the horizontal moving table 342 (or Y-axis movable body 341), and projects below the Y-axis movable body 341.

The pair of sidewalls 42 is fixed to an upper surface of the horizontal moving table 342. In a side view, each sidewall 42 has a generally rectangular shape that extends longer along the X-axis direction and shorter along the Z-axis direction. Further, the connecting wall 43 is connected to an intermediate position along the X-axis direction (the longer side) of each sidewall 42. In addition, a length of each sidewall 42 along the Z-axis direction is set shorter than a raising and lowering distance of the base 35. A plurality of spaces 420 for tightening screws are formed at predetermined positions of the pair of sidewalls 42 at locations closer to the lower surface than to the upper surface of each sidewall 42. A fastening screw 421 penetrates each sidewall 42 through the space 420, and is screwed into the horizontal moving table 342, so as to rigidly fix the support frame 41 to the horizontal moving table 342 (refer also to FIG. 3).

The connecting wall 43 is formed to a generally rectangular shape extending along the Y-axis direction (or width direction) and the Z-axis direction (a height direction or the vertical direction). A length of the connecting wall 43 along the Y-axis direction is longer than the length of the sidewall 42 along the X-axis direction. In addition, because the length of the connecting wall 43 along the Z-axis direction is sufficiently longer than (for example, approximately two times) the length of the sidewall 42 along the Z-axis direction, the support frame 41 has a shape such that a lower side of the connecting wall 43 projects more downward than the pair of sidewalls 42.

The guides 48 of the four elevators 45 are fixed to wall surfaces 43a and 43b of the connecting wall 43, respectively. The guide 48 includes a pair of rails 49 extending in the Z-axis direction. The pair of rails 49 extends linearly from an upper end to a lower end of the connecting wall 43, and is rigidly fixed to the connecting wall 43 by a fixing means, such as screws or the like. In addition, the guide 48 includes a movement restricting block 50 for restricting raising of the Z-axis movable body 46, provided between the pair of rails 49 at an upper end of the wall surfaces 43a and 43b of the connecting wall 43, respectively.

The Z-axis moving mechanism 40 includes two guides 48 (the pair of rails 49 and the movement restriction block 50) on one wall surface 43a along the X-axis direction of the connecting wall 43, and two guides 48 on the other wall surface 43b along the X-axis direction of the connecting wall 43. Because the two guides 48 on the one wall surface 43a and the two guides 48 on the other wall surface 43b are arranged side by side along the Y-axis direction, respectively, four rails 49 extend parallel to each other along the Z-axis direction on each of the one wall surface 43a and the other wall surface 43b.

Returning to the description of FIG. 3, the driving motor 47 of the elevator 45 is fixed to the horizontal moving table 342, and includes a shaft 470 projecting in a positive Z-axis direction. A type of the driving motor 47 is not particularly limited, but from a viewpoint of reducing the size of the Z-axis moving mechanism 40, a direct driving motor (or direct drive motor) may be used, for example. The direct driving motor is configured to have a low height with respect to an axial direction of the shaft 470, and includes no reduction gear mechanism. Further, the direct driving motor can rotate at a low speed with a high torque.

A power converter 51 for converting a rotational motion of the driving motor 47 into a linear motion of the Z-axis movable body 46 is provided between the driving motor 47 and the Z-axis movable body 46. For example, the power converter 51 may employ a structure in which a ball screw 53 is screwed into a nut 52 that is connected to a rotor (not illustrated) of the driving motor 47. The ball screw 53 is provided coaxially to the shaft 470 of the driving motor 47, so that splines mate at an appropriate position inside the driving motor 47, and the Z-axis movable body 46 is fixed to an upper end of the ball screw 53. By the power converter 51, the elevator 45 causes the ball screw 53 (or shaft 470) to reciprocate along the Z-axis direction when the nut 52 rotates, thereby raising and lowering the Z-axis movable body 46 with the rotation of the ball screw 53.

Further, the driving motor 47 includes an encoder 54 for detecting a rotation angle of the rotor, and a torque sensor 55 (refer to FIG. 6) for detecting a load value applied from the base 35 to the rotor as a torque value (or current value).

The Z-axis movable body 46 of the elevator 45 is a member for supporting the base 35, and the base 35 is raised and lowered by raising and lowering the Z-axis movable body 46 based on driving of the driving motor 47. The Z-axis moving mechanism 40 according to the present embodiment can adjust the tilt of the base 35, by independently raising and lowering each of the four Z-axis movable bodies 46 (or elevator 45).

Figure 5:
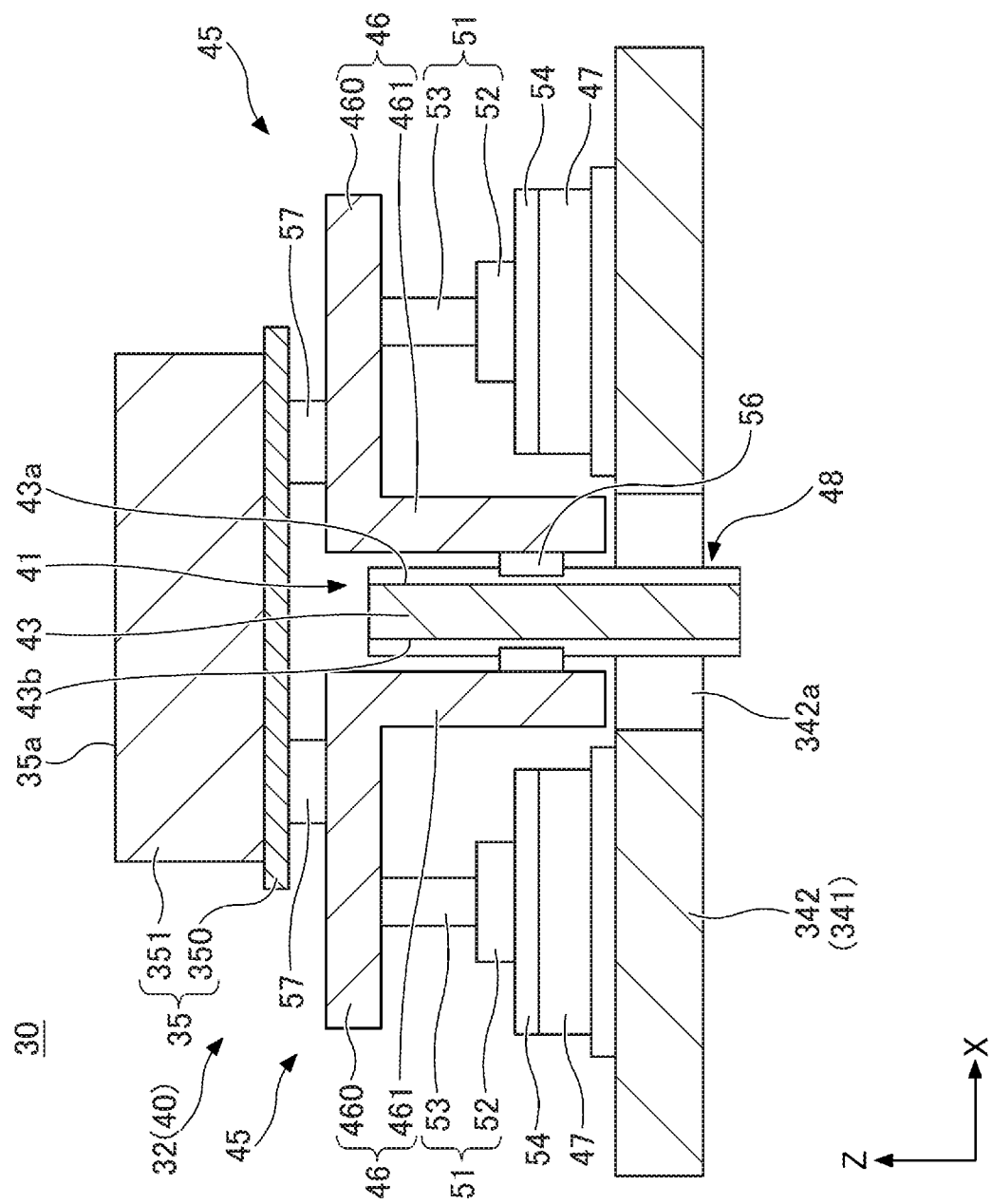
FIG. 5 is a longitudinal cross sectional view schematically illustrating the Z-axis moving mechanism.

FIG. 5 is a longitudinal cross sectional view schematically illustrating the Z-axis moving mechanism 40. As illustrated in FIG. 5, the Z-axis movable body 46 includes a horizontally extending portion 460 parallel to the horizontal direction (X-axis-Y-axis direction), and a vertically extending portion 461 connected to the horizontally extending portion 460 and parallel to the vertical direction. The Z-axis movable body 46 is formed to an approximately L-shape in a cross sectional side view.

The horizontally extending portion 460 is formed to a generally polygonal shape in the plan view, and the ball screw 53 (or shaft 470) is connected to the horizontally extending portion 460 at a position closer to an outer side (or separated from the connecting wall 43) along the X-axis direction relative to a center portion along the X-axis direction. The Z-axis movable body 46 is raised and lowered in the vertical direction, based on the linear motion of the ball screw 53 along the Z-axis direction.

The vertically extending portion 461 is provided at a position adjacent to the connecting wall 43 of the support frame 41, so as to oppose the connecting wall 43. The vertically extending portion 461 is formed to a generally rectangular shape that extends shorter along the Y-axis direction and longer along the Z-axis direction. A pair of sliders 56 to be disposed on the pair of rails 49 is provided on a surface of the vertically extending portion 461 opposing the connecting wall 43 of the support frame 41. The sliders 56 engage the rails 49, so as to guide the movement of the Z-axis movable body 46 along the Z-axis direction (or extending direction of the rails 49). A combination of the rails 49 and the sliders 56 guides the movement of the Z-axis movable body 46 along the Z-axis direction, while preventing the Z-axis movable body 46 from disengaging in the horizontal direction (X-axis-Y-axis direction).

Moreover, as illustrated in FIG. 3, the Z-axis movable body 46 includes a contact 57 for making contact with the bottom plate 350 of the base 35, fixed to an upper surface of the horizontally extending portion 460. That is, the base 35 is supported by four contacts 57. The contact 57 is formed to a hard block having a flat top surface. The Z-axis moving mechanism 40 may be configured such that a load sensor, such as a load cell or the like, is used in place of the contact 57. Thus, the stage controller 70 can even more accurately recognize a tilted state or the like of the base 35, for example, using the load detected by the load sensor.

Figure 6:
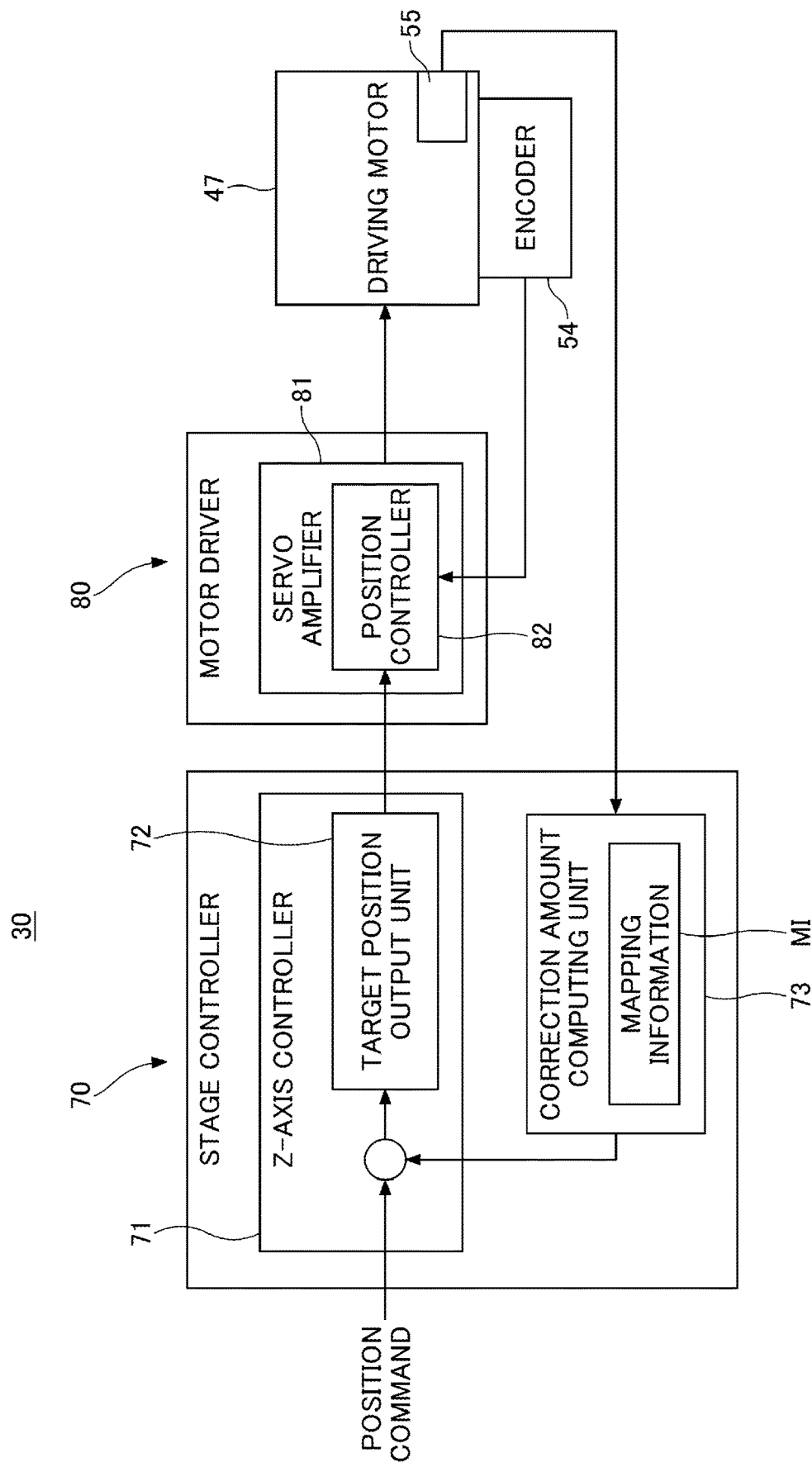
FIG. 6 is a block diagram illustrating a driving motor, a motor driver, and a stage controller of the Z-axis moving mechanism.

FIG. 6 is a block diagram illustrating the driving motor 47, the motor driver 80, and the stage controller 70 of the Z-axis moving mechanism 40. As illustrated in FIG. 6, the stage controller 70 includes a Z-axis controller 71 for driving the driving motor 47, for each of the four driving motors 47. In addition, the motor driver 80 includes a servo amplifier 81 for controlling a current supplied to the driving motor 47 based on a target position of each Z-axis controller 71, for each of the four driving motors 47. The servo amplifier 81 may be provided integrally with the driving motor 47.

A PLC or the like may be used for the Z-axis controller 71, and the Z-axis controller 71 receives a position command related to the raised or lowered position of the base 35 from the main controller of the stage controller 70 for each control period, to compute the target position of the driving motor 47. The PLC includes a processor (or integrated circuit). The Z-axis controller 71 includes a target position output unit 72 for outputting the computed target position to the servo amplifier 81. The servo amplifier 81 adjusts the power supplied to the driving motor 47 according to the target position received from the target position output unit 72.

The rotation angle of the rotor detected by the encoder 54 provided in the driving motor 47 is fed back to a position controller 82 of the servo amplifier 81. The servo amplifier 81 computes a difference of an actual position with respect to the target position in the position controller 82, and adjusts the power supplied to the driving motor 47 according to the computed difference.

On the other hand, a torque detected by the torque sensor 55 is transmitted to the stage controller 70. The torque detected by the torque sensor 55 corresponds to a load value of the loads applied to the wafer W and the base 35 from the plurality of probes 16 and distributed to the elevators 45, respectively. The stage controller 70 includes a correction amount computing unit 73 for computing a correction amount (or tilt correction amount) with respect to the target position, based on the torque received from the torque sensor 55.

The correction amount computing unit 73 finally computes the tilt correction amounts for correcting the target positions of the four driving motors 47, based on the torques detected by the four torque sensors 55. For example, the correction amount computing unit 73 extracts load applying positions on the base 35 where the loads of the plurality of probes 16 are applied, from the torques detected by the four torque sensors 55, and further estimates the tilted state of the entire base 35 from the load applying positions, to thereby determine the correction amounts based on the tilted state.

Preferably, each torque applied to each driving motor 47 when the plurality of probes 16 makes contact with the wafer W at the several tens to several hundred positions set on the base 35, is prestored in a database. In this case, the correction amount computing unit 73 can recognize the load applying positions based on the four acquired torques. For example, the correction amount computing unit 73 holds mapping information MI or a function of a load-tilt (or load versus tilt) characteristic representing a relationship between the load applying positions and the tilted state of the base 35, and estimates the tilted state of the entire base 35, based on the recognized load applying positions. The tilted state of the base 35 is represented by a position of the base 35 tilted in the X-axis-Y-axis direction, or a degree of tilt (or amount of tilt) of the base 35.

The correction amount computing unit 73 sets the tilt correction amount of each driving motor 47 for leveling the placing surface 35a of the base 35 to a horizontal state, based on the estimated tilted state of the entire base 35. For example, the tilt correction amount can be computed from the tilted state, using a predetermined arithmetic expression, or using data describing the tilt correction amount of each driving motor 47 corresponding to the tilted state. Hence, in a case where the torque of one driving motor 47 is large relative to the torque of another driving motor 47, for example, the load of the probe 16 applied to the one driving motor 47 is large. For this reason, the correction amount computing unit 73 sets the tilt correction amount of the one driving motor 47 on which the relatively large torque is applied, to a value larger than the tilt correction amount of the other driving motor 47.

When the four Z-axis controllers 71 receive the tilt correction amounts computed by the correction amount computing unit 73, respectively, the four Z-axis controllers 71 compute corrected target positions by adding the respective tilt correction amounts to the position commands of the same periods as the reception timings of the tilt correction amounts. The target position output units 72 output the corrected target positions to the servo amplifiers 81. Hence, the Z-axis moving mechanism 40 can appropriately raise and lower each of the four elevators 45 (or drive the driving motors 47) to level the base 35 to the horizontal state, even when the base 35 tilts due to the loads applied by the probes 16.

Returning to the description of FIG. 2, the needle polishing mechanism 60 disposed at the position adjacent to the stage 30 also includes a polishing side Z-axis moving mechanism 62 having the same configuration as the stage 30. That is, the polishing side Z-axis moving mechanism 62 includes a polishing side support frame 63, and four polishing side elevators 64, supported by the polishing side support frame 63, for raising and lowering the polishing body 61. Similar to the support frame 41, the polishing side support frame 63 includes a pair of sidewalls (not illustrated), and a connecting wall (not illustrated), and is formed to an H-shape in the plan view. In addition, similar to the elevators 45, each polishing side elevator 64 includes a polishing side driving motor 65, a polishing side power converter 66, a polishing side Z-axis movable body 67, and an polishing side guide 68.

This polishing side Z-axis moving mechanism 62 can also correct the tilt of the polishing body 61 by the four polishing side elevators 64 when the polishing body 61 makes contact with the probes 16. In other words, the needle polishing mechanism 60 also has a function to suitably adjust an attitude of the polishing body 61 (corresponding to the base 35 of the present disclosure) that receives the loads. That is, when polishing the probes 16, the needle polishing mechanism 60 can equalize polishing amounts of the probes 16 by maintaining the polishing body 61 in the horizontal state.

The stage 30 and the testing apparatus 1 according to the present embodiment are basically configured as described above, and operations thereof will be described below.

First, the significance of the Z-axis moving mechanism 40 having the four elevators 45 will be described with reference to FIG. 7A and FIG. 7B. FIG. 7A and FIG. 7B are diagrams schematically illustrating an arrangement example of the shaft 470 of the driving motor 47 (or elevator 45) of the Z-axis moving mechanism 40. FIG. 7A illustrates the Z-axis moving mechanism 40 according to the present embodiment, and FIG. 7B illustrates a Z-axis moving mechanism 100 according to a reference example. In FIG. 7A and FIG. 7B, lines connecting the four driving motors 47 or three driving motors 47 circumscribe the base 35, but these lines may be positioned on the inner side of the base 35.

As illustrated in FIG. 7B, the Z-axis moving mechanism 100 according to the reference example raises and lowers the base 35 by the three driving motors 47. In this case, the three driving motors 47 are disposed at positions far away from the base 35, so as to stably balance the attitude of the base 35. That is, in the Z-axis moving mechanism 100 that supports the base 35 by the three driving motors 47, a planar size of the stage 30 becomes large.

On the other hand, as illustrated in FIG. 7A, the Z-axis moving mechanism 40 according to the present embodiment raises and lowers the base 35 by the four driving motors 47. In the Z-axis moving mechanism 40, the four driving motors 47 can be disposed at positions near the base 35 when compared to the Z-axis moving mechanism 100 according to the reference example. In other words, the Z-axis moving mechanism 40 can stably balance the attitude of the base 35, while making the planar size of the stage 30 small by disposing the four driving motors 47 at the positions near the base 35.

FIG. 8 is a flow chart for explaining the operation of the stage 30 when testing the wafer W. FIG. 9A and FIG. 9B are diagrams illustrating the operation of the base 35 by the stage 30 with respect to the loads of the probes 16. FIG. 9A illustrates a case where a center of the loads of the probes 16 is offset, and FIG. 9B illustrates the adjustment of the attitude of the base 35.

When testing the wafer W in the testing apparatus 1, the wafer W is placed on the placing surface 35a of the base 35 of the stage 30 under the control of the controller 90. When the wafer W is placed on the base 35, the stage controller 70 receives a move command from the controller 90. Thus, as illustrated in FIG. 8, the stage controller 70 controls the moving part 32, and transports the wafer W along the horizontal direction (X-axis-Y-axis direction, step S1). The stage 30 disposes the wafer W under the tester 20 by this transport in the horizontal direction.

Next, the stage controller 70 outputs the target positions of the driving motors 47 from the Z-axis controllers 71 to the servo amplifiers 81, respectively (step S2). Accordingly, appropriate power is supplied from the servo amplifiers 81 to the driving motors 47, respectively, and each driving motor 47 raises the base 35 in the upward vertical direction. The Z-axis movable bodies are guided by the guides 48 fixed to the support frame 41 that is continuous along the direction perpendicular to the raising and lowering direction, respectively, when the driving motors 47 are driven to raise the base 35. For this reason, each Z-axis movable body 46 is smoothly displaced along the vertical direction, to thereby raise the base 35 without rattling. The stage controller 70 also raises each Z-axis movable body 46 at the same raising speed until the base 35 makes contact with the probes 16 of the probe card 15. Accordingly, the stage 30 can satisfactorily maintain the horizontal state of the placing surface 35a of the base 35.

When the base 35 is raised, each of the probes 16 supported by the tester 20 makes contact with the wafer W. In this state, as illustrated in FIG. 9A, if a center of gravity of the loads of the probes 16 is offset from the center of the base 35, a tilt (or inclination) is generated in the base 35. As an example, in a case where a load of approximately 500 kg is applied near an outer periphery of the base 35 from each of the probes 16, the base 35 will tilt in units of μm.

For this reason, the stage controller 70 independently controls the four elevators 45 of the Z-axis moving mechanism 40, and corrects the tilted state of the base 35, thereby leveling the placing surface 35a to the horizontal state. More particularly, when the base 35 is raised, the stage controller 70 acquires the torques (load values) from the torque sensors 55, respectively (step S3).

In addition, the stage controller 70 acquires each of the torques in real time when the probes 16 make contact with the wafer W at arbitrary positions on the wafer W, and computes the tilt correction amount for each of the four elevators 45 by the correction amount computing unit 73 (step S4). As described above, the correction amount computing unit 73 extracts the load applying positions of the probes 16 based on the torques, respectively, estimates the tilted state of the entire base 35 from the load applying positions, and computes the tilt correction amounts based on the tilted state. The tilt correction amounts are values capable of correcting the tilted state of the base 35 in three-dimensional coordinates with a high accuracy.

The Z-axis controllers 71 of the stage controller 70 add the tilt correction amounts transmitted from the correction amount computing unit 73 to the position commands, and output the corrected target positions to the servo amplifiers 81, respectively (step S5). Accordingly, the servo amplifiers 81 supply the power according to the estimated target positions to the driving motors 47, respectively, and the driving motors 47 rotate independently of each other to raise or lower the Z-axis movable bodies 46. For example, in the stage 30 illustrated in FIG. 9B, one or two Z-axis movable bodies 46 near the positions where the loads from the probes 16 are applied to the base 35 are raised slightly more than the Z-axis movable bodies 46 at other positions. As a result, the stage 30 can correct the tilt of the placing surface 35a of the base 35, to thereby level the placing surface 35a to the horizontal state.

Because the stage 30 maintains the placing surface 35a in the horizontal state, it is possible to reduce inconsistencies in the loads of the probes 16, and stabilize contact resistances of the probes 16. For this reason, the stage controller 70 transmits information indicating that the tilt of the base 35 is corrected, to the controller 90 of the testing apparatus 1, in order to start the electrical test of the wafer W (step S6). Based on this information, the controller 90 starts testing the wafer W transported to the stage 30. The controller 90 may receive image information from the test camera 29 and recognize that the placing surface 35a is leveled to the horizontal state, to thereby start the electrical test. In this case, the testing apparatus 1 can test the wafer W with a high accuracy, and improve a yield when testing the wafer W.

Figure 10B:
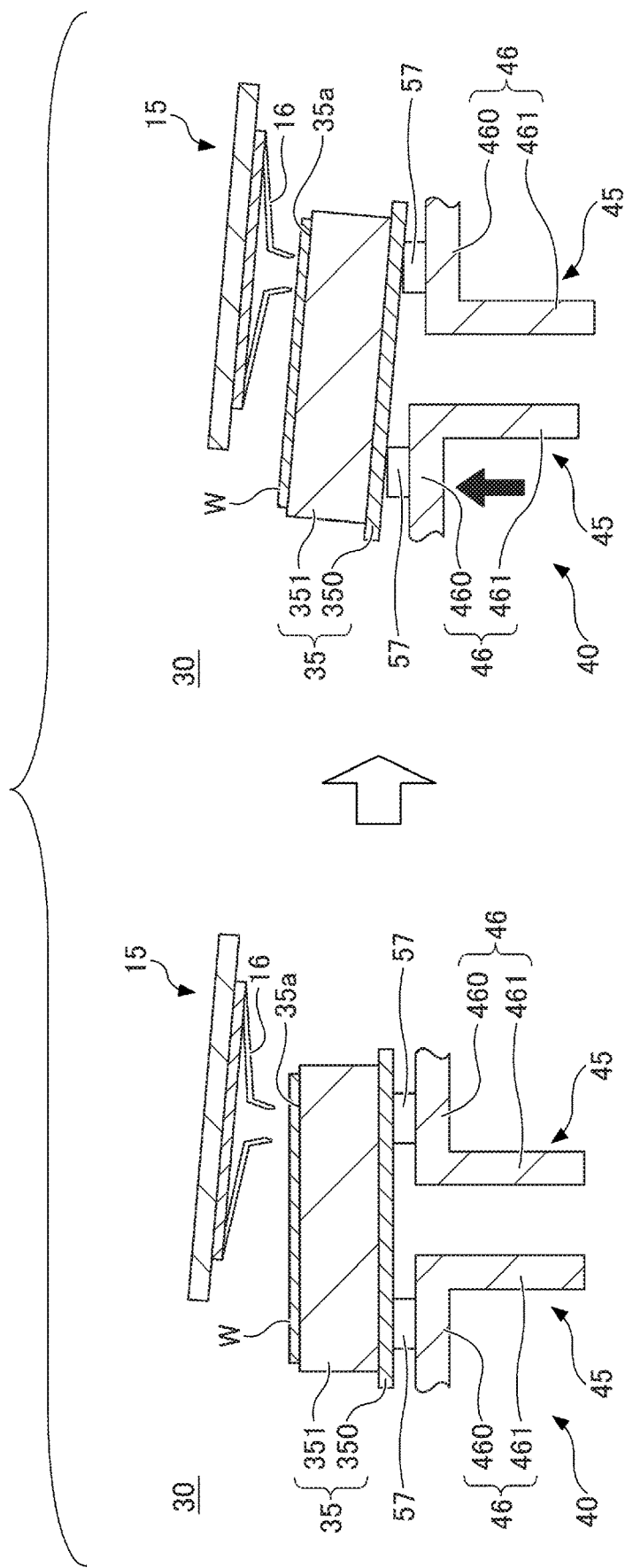
FIG. 10B is a diagram schematically illustrating a parallel correction by the stage.

Further, the Z-axis moving mechanism 40 including the four elevators 45 is not limited to adjusting the tilt of the base 35, and may perform various controls when testing the wafer W. Hereinafter, other controls performed by the Z-axis moving mechanism 40 will be described with reference to FIG. 10A and FIG. 10B. FIG. 10A is a diagram schematically illustrating a placing surface correction by the stage 30, and FIG. 10B is a diagram schematically illustrating a parallel correction by the stage 30.

As illustrated in FIG. 10A, the base 35 may receive effects of temperature and become deformed such that the placing surface 35a warps to a concave or convex shape, for example, to thereby deteriorate a flatness of the placing surface 35a. For this reason, the stage 30 may perform the placing surface correction using the Z-axis moving mechanism 40. In the placing surface correction, the stage controller 70 detects the warp of the placing surface 35a, based on the image information of the placing surface 35a captured by the test camera 29, and independently adjusts the raising and lowering of the four elevators 45 according to the detected warp of the placing surface 35a. Accordingly, even in a case where the placing surface 35a warps, the placing surface 35a at the positions where the plurality of probes 16 make contact therewith can be leveled to the horizontal state, and it is possible to stabilize the contact resistance of each of the probes 16.

In addition, as illustrated in FIG. 10B, in a case where the probe card 15 is tilted, the stage 30 can perform a parallel correction that tilts the placing surface 35a of the base 35 to match the tilt of the probe card 15. For example, in the parallel correction, the stage 30 computes a tilted state (a direction of the tilt, and an amount of tilt) of the probe card 15, based on image information of the probe card 15 captured by the stage camera 19, and independently adjusts the raising and lowering of the four elevators 45 according to the tilted state of the probe card 15. Hence, even in a case where the probe card 15 is tilted, the placing surface 35a can be made to oppose and be parallel to the plurality of probes 16, and it is possible to stabilize the contact resistance of each of the probes 16.

Figure 11A:
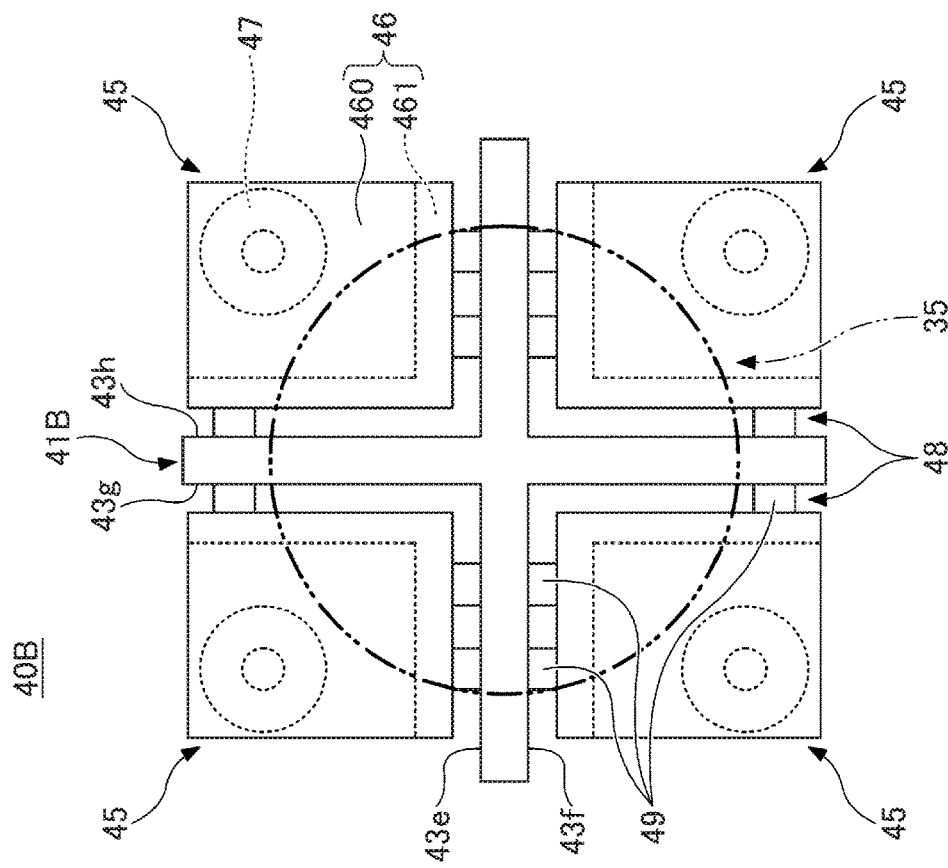
FIG. 11A and FIG. 11B are diagrams schematically illustrating the Z-axis moving mechanism according to modifications.
Figure 11B:
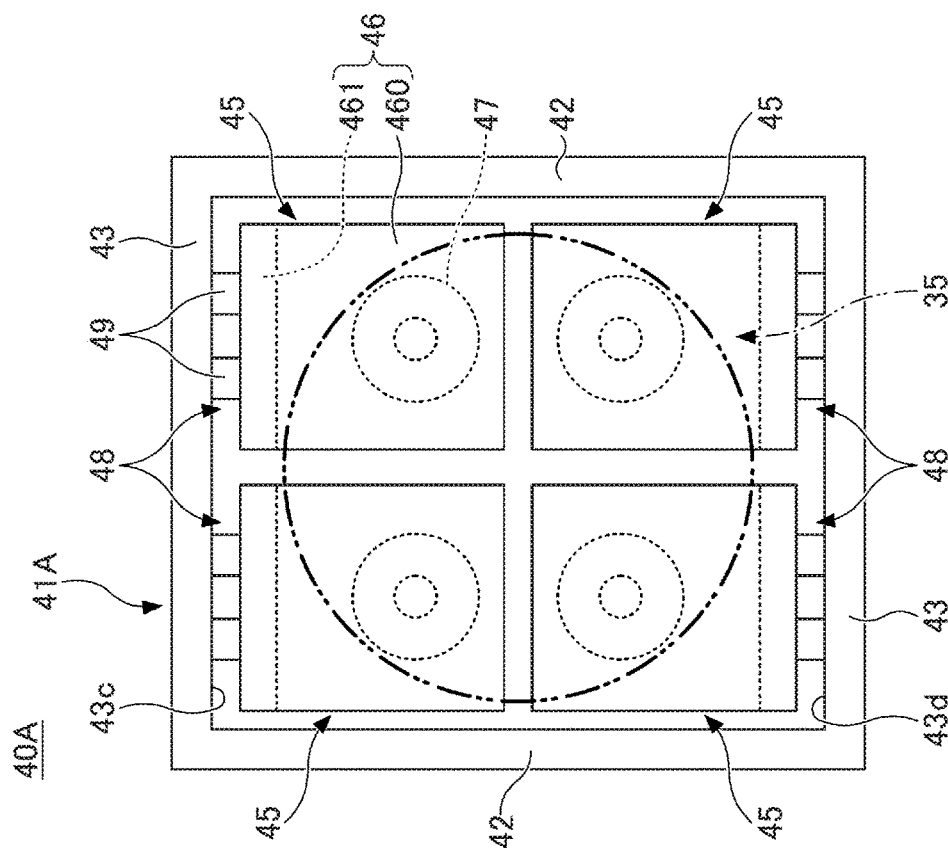

Further, the stage 30 is not limited to that of the embodiments described above, and various modifications may be made. FIG. 11A and FIG. 11B are diagrams schematically illustrating Z-axis moving mechanisms 40A and 40B according to modifications. FIG. 11A illustrates the Z-axis moving mechanism 40A having a square-shaped support frame 41A, and FIG. 11B illustrates the Z-axis moving mechanism 40B having a cross-shaped support frame 41B.

As illustrated in FIG. 11A, the Z-axis moving mechanism 40A may have a configuration including the support frame 41A having a rectangular shape (or annular square shape) in the plan view, and having the guides 48 of the four elevators 45 fixed to inner wall surfaces 43c and 43d of the support frame 41A. For example, two guides 48 are provided on each of the pair of short sides of the support frame 41, to guide the displacement of the Z-axis movable body 46 disposed on the inside. Even in this case, the support frame 41 can correct the tilt of the base 35, by stably raising and lowering each of the elevators 45.

As illustrated in FIG. 11B, the Z-axis moving mechanism 40B may have a configuration including the support frame 41B having a cross shape in the plan view, and having the guides 48 of the four elevators 45 fixed to wall surfaces 43e, 43f, 43g, and 43h of the support frame 41. Even in this case, the support frame 41 can rigidly fix the guides 48, so that it is possible to stably raise and lower each of the elevators 45. As illustrated in FIG. 11B, the guide 48 of each of the elevators 45 may include a plurality of rails 49 provided on the different wall surfaces 43e, 43f, 43g, and 43h (this configuration may be applied to other Z-axis moving mechanisms 40 and 40A).

FIG. 12A and FIG. 12B are diagrams schematically illustrating elevators 45A and 45B according to modifications. FIG. 12A illustrates a magnetic geared motor 58A applied to the driving motor 47, and FIG. 12B illustrates a magnetic reduction gear mechanism 58B applied between the driving motor 47 and the Z-axis movable body 46. As illustrated in FIG. 12A and FIG. 12B, the stage 30 may include a magnetic decelerator 58 for magnetically reducing the rotational motion of the driving motor 47, provided in the four driving motors 47 themselves, or provided between the four Z-axis movable bodies 46 and the four driving motors 47, respectively.

For example, as illustrated in FIG. 12A, the magnetic decelerator 58 may have a configuration including the magnetic geared motor 58A having a magnetic deceleration function, used as the driving motor 47. As an example, the magnetic geared motor 58A includes a stator 581, and a high-speed rotor 582 and a low-speed rotor 583 provided coaxially to the stator 581. The stator 581 is positioned on an outer periphery of the magnetic geared motor 58A, and a plurality of coils is disposed in a ring shape along a circumferential direction. Under the control of the Z-axis controller 71, the motor driver 80 supplies three-phase AC power to each of the coils. The high-speed rotor 582 is provided on the central side of the magnetic geared motor 58A, and a plurality of magnetic poles (N-poles and S-poles) are disposed on an outer peripheral surface of the high-speed rotor 582 in a ring shape along the circumferential direction. The low-speed rotor 583 is an annular member disposed between the stator 581 and the high-speed rotor 582, and includes a plurality of pole pieces disposed in a ring shape along the circumferential direction. The power converter 51 (refer to FIG. 3), that converts the rotation of the low-speed rotor 583 into a linear motion of the Z-axis movable body 46, is connected to the low-speed rotor 583.

The magnetic geared motor 58A having the configuration described above rotates the inner high-speed rotor 582, based on the three-phase AC power from the motor driver 80 (refer to FIG. 2). In addition, according to the rotation of the high-speed rotor 582, the low-speed rotor 583, that is disposed on the outer side of the high-speed rotor 582, rotates at a low speed with a high torque. A reduction gear ratio of the magnetic geared motor 58A can be set based on a ratio of the number of magnetic poles of the high-speed rotor 582 and the number of pole pieces of the low-speed rotor 583. By using the magnetic geared motor 58A as described above, the elevator 45A can significantly reduce a power consumption when raising and lowering the Z-axis movable body 46. Moreover, by reducing the size and increasing the torque of the magnetic geared motor 58A, the magnetic geared motor 58A can minimize a footprint. Further, because the magnetic geared motor 58A can transfer the torque without mutual contact between the high-speed rotor 582 and the low-speed rotor 583, it is possible to reduce vibration, and improve a contact performance of the wafer W when moving the stage 30. As a result, an improved yield when testing the wafer W can be expected.

Alternatively, as illustrated in FIG. 12B, the magnetic decelerator 58 may have a configuration including the magnetic reduction gear mechanism 58B provided between the driving motors 47 and the Z-axis movable bodies 46 (or power converters 51), respectively. The magnetic reduction gear mechanism 58B includes a stator 586 having a plurality of pole pieces disposed in a ring shape, a high-speed rotor 587 having a plurality of magnetic poles disposed in a ring shape on an inner side of the stator 586, and a low-speed rotor 588 having a plurality of magnetic poles disposed in a ring shape on an outer side of the stator 586. In this case, the stator 586 is fixed, while the high-speed rotor 587 is connected to the shaft 470 of the driving motor 47. The high-speed rotor 587 rotates following the rotation of the driving motor 47. The low-speed rotor 588 rotates at a reduced speed with respect to the rotation of the high-speed rotor 587, because the rotation of the magnetic poles of the high-speed rotor 587 is transmitted via the plurality of pole pieces of the stator 586. Accordingly, similar to the magnetic geared motor 58A, the elevator 45B including the magnetic reduction gear mechanism 58B can obtain the effects of reducing the power consumption, reducing the size, reducing a weight, reducing the vibration, or the like.

Next, technical features and effects of the present disclosure described above in conjunction with the embodiments and modifications will be described below.

According to a first aspect of the present disclosure, a stage 30 includes a base 35 on which an object to be transported or tested (or wafer W) is placed; four movable bodies (Z-axis movable bodies 46) configured to support the base 35 in a manner so that the base 35 can be raised and lowered; four driving motors 47, provided in correspondence with the four movable bodies, and configured to independently raise and lower the four movable bodies, respectively; four guides 48 configured to guide the four movable bodies, respectively; and a support frame 41, 41A, and 41B, having wall surfaces 43a through 43h parallel to a raising and lowering direction of the base 35 and continuous along a direction perpendicular to the raising and lowering direction of the base 35, and the four guides 48 fixed to the wall surfaces 43a through 43h.

According to the configuration described above, the stage 30 can suitably adjust the attitude of the base 35 by independently raising and lowering the four movable bodies (Z-axis movable bodies 46). In particular, the stage 30 is provided with the support frame 41, 41A, and 41B, that is continuous in the direction perpendicular to the raising and lowering direction, for fixing the four guides 48, thereby enabling each movable body to be raised and lowered smoothly, promoting equalization of the loads applied to the base 35. In addition, the four movable bodies, the four driving motors 47, and the four guides 48 can minimize the planar size of the stage 30.

In addition, the stage 30 may include a controller (stage controller 70) for setting target positions of the four driving motors 47, respectively, when raising and lowering the base 35, and controlling operations of the four driving motors 47 based on the target positions, and four torque sensors 55 for detecting torques of the four driving motor 47, provided in the four driving motors 47, respectively. The controller corrects the target positions of the four driving motors 47, based on the torques fed back from the four torque sensors 55. Hence, the stage 30 can raise and lower the four movable bodies with a high accuracy, based on the loads applied to the base 35.

Moreover, the controller (stage controller 70) may recognize a tilted state of the base 35, based on the torques detected by the four torque sensors 55, and compute correction values for correcting the target positions of the four driving motors 47 according to the tilted state of the base 35, respectively. Accordingly, the stage 30 can control the four driving motors 47 with an even higher accuracy, and quickly return the base 35 to a horizontal state even when the base 35 is tilted from the horizontal state, for example.

Further, the support frame 41 may include a pair of sidewalls 42, and a connecting wall 43 that connects between the pair of sidewalls 42, in the direction perpendicular to the raising and lowering direction, to form an H-shape in a plan view. The four movable bodies (Z-axis movable bodies 46), the four driving motors 47, and the four guides 48 may be disposed between the pair of sidewalls 42. According to this configuration, the stage 30 can stably support the four guides 48 by the support frame 41, thereby enabling the movable body to be smoothly raised and lowered.

The support frame 41 may have two of the four guides 48 fixed to one wall surface 43a of the connecting wall 43, and the remaining two of the four guides 48 fixed to the other wall surface 43b of the connecting wall 43. According to this configuration, the stage 30 can have the two movable bodies (Z-axis movable bodies 46) disposed side by side along a direction in which the connecting wall 43 extends, thereby enabling the planar size of the stage 30 to be reduced.

Each of the four movable bodies (Z-axis movable bodies 46) may have a horizontally extending portion 460 connected to a corresponding one of the four driving motors 47, and a vertically extending portion 461 extending in a direction perpendicular to a direction in which the horizontally extending portion 460 extends and guided by a corresponding one of the four guides 48. According to this configuration, the four movable bodies can have a long contact interval in contact with the guides 48, and be raised and lowered even more stably along the guides 48.

The support frame 41, 41A, and 41B, and the four guides 48 may extend longer along the raising and lowering direction than the four driving motors 47. Accordingly, the stage 30 can increase a raising and lowering distance (or guiding distance) of the movable bodies (the Z-axis movable bodies 46), and also stably raise and lower the movable bodies.

The four driving motors 47 may be direct driving motors. In this case, the stage 30 can reduce the height of the driving motor 47, and promote a size reduction of the base 35 in the raising and lowering direction.

The magnetic decelerator 58 for magnetically reducing the rotational motion of the driving motor 47, may be provided in the four driving motors 47 themselves, or may be provided between the four movable bodies (Z-axis movable bodies 46) and the four driving motors 47, respectively. In this case, the stage 30 can obtain the effects of reducing the power consumption, reducing the size, reducing the weight, reducing the vibration, or the like.

The magnetic decelerator 58 may include a magnetic geared motor 58A forming the driving motor 47 itself and having a stator 581, and a high-speed rotor 582 and a low-speed rotor 583 provided coaxially to the stator 581. By employing the magnetic geared motor 58A, the stage 30 can promote a size reduction (for example, a height reduction in the Z-axis direction, or the like) of the driving motor 47 itself, thereby promoting a further size reduction of the entire stage 30.

The magnetic decelerator 58 may include a magnetic reduction gear mechanism 58B having a stator 586, and a high-speed rotor 587 and a low-speed rotor 588 provided coaxially to the stator 586, provided between the four movable bodies (Z-axis movable bodies 46) and the four driving motors 47, respectively. Even in this case where the magnetic reduction gear mechanism 58B is provided, the stage 30 can smoothly reduce the rotation of the driving motor 47 and raise and lower the Z-axis movable body 46. For this reason, it is possible to employ the driving motor 47 having a small size, thereby promoting the size reduction of the entire stage 30.

According to a second aspect of the present disclosure, a testing apparatus 1 includes a stage 30 on which a substrate (or wafer W) to be tested is placed for testing electrical characteristics of the substrate that is transported by pressing probes 16 against the substrate, wherein the stage 30 includes a base 35, four movable bodies (Z-axis movable bodies 46) configured to support the base 35 in a manner so that the base 35 can be raised and lowered, four driving motors 47, provided in correspondence with the four movable bodies, and configured to independently raise and lower the four movable bodies, respectively, four guides 48 configured to guide the four movable bodies, respectively, and a support frame 41, 41A, and 41B, having wall surfaces 43a through 43h parallel to a raising and lowering direction of the base 35 and continuous along a direction perpendicular to the raising and lowering direction of the base 35, and the four guides 48 fixed to the wall surfaces 43a through 43h.

According to a third aspect of the present disclosure, a method for operating a stage 30 includes the steps of transporting a base 35; and raising and lowering the base 35 by four movable bodies (Z-axis movable bodies 46) provided in four driving motors 47, respectively by independently driving the four driving motors 47, wherein the step of raising and lowering the base 35 guides raising and lowering of the four movable bodies by four guides 48 fixed to wall surfaces 43a through 43h of a support frame 41, 41A, and 41B, and the wall surfaces 43a through 43h are parallel to a raising and lowering direction of the base 35 and continuous along a direction perpendicular to the raising and lowering direction of the base 35.

According to the second and third aspects of the present disclosure, it is also possible to suitably adjust the attitude of the base 35, and promote equalization of the loads applied to the base 35.

Hence, according to the present disclosure, it is possible to promote equalization of the load applied to the base by suitably adjusting an attitude of the base.

The stage 30, the testing apparatus 1, and the method for operating the stage 30 according to the embodiments disclosed herein have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosures.

What is claimed is:

1. A stage comprising:
  a base on which an object to be transported or tested is placed;
  four movable bodies configured to support the base in a manner so that the base can be raised and lowered;
  four driving motors, provided in correspondence with the four movable bodies, and configured to independently raise and lower the four movable bodies, respectively;
  four guides configured to guide the four movable bodies, respectively; and
  a support frame, having wall surfaces parallel to a raising and lowering direction of the base and continuous along a direction perpendicular to the raising and lowering direction of the base, and the four guides fixed to the wall surfaces.

2. The stage as claimed in claim 1, further comprising:
  a controller configured to control operations of the four driving motors based on target positions, by setting the target positions for the four driving motors when raising and lowering the base, respectively; and
  four torque sensors, provided in the four driving motors, and configured to detect torques of the four driving motors, respectively,
  wherein the controller corrects the target positions of the four driving motors, based on the torques fed back from the four torque sensors, respectively.

3. The stage as claimed in claim 2, wherein the controller recognizes a tilted state of the base based on the torques detected by the four torque sensors, and computes correction values for correcting the target positions of the four driving motors according to the tilted state of the base.

4. The stage as claimed in claim 1, wherein
  the support frame includes a pair of sidewalls, and a connecting wall connecting between the pair of sidewalls, in the direction perpendicular to the raising and lowering direction, so that the support frame forms an H-shape in a plan view, and
  the four movable bodies, the four driving motors, and the four guides are disposed between the pair of sidewalls.

5. The stage as claimed in claim 4, wherein the support frame has two of the four guides fixed to one of wall surfaces of the connecting wall, and the remaining two of the four guides fixed to the other of the wall surfaces of the connecting wall.

6. The stage as claimed in claim 1, wherein the four movable bodies include horizontally extending portions connected to the four driving motors, respectively, and vertically extending portions, extending in a direction perpendicular to a direction in which the horizontally extending portions extend, and guided by the four guides, respectively.

7. The stage as claimed in claim 6, wherein the support frame and the four guides extend longer along the raising and lowering direction than the four driving motors.

8. The stage as claimed in claim 1, wherein the four driving motors are direct driving motors, respectively.

9. The stage as claimed in claim 1, further comprising:
a magnetic decelerator configured to magnetically reduce a rotational motion of a driving motor, provided in the four driving motors themselves or between the four movable bodies and the four driving motors, respectively.

10. The stage as claimed in claim 9, wherein the magnetic decelerator is a magnetic geared motor including a stator, and a high-speed rotor and a low-speed rotor provided coaxially to the stator, and forming each of the four driving motors itself.

11. The stage as claimed in claim 9, wherein
the magnetic decelerator is a magnetic reduction gear mechanism provided between the four movable bodies and the four driving motors, respectively, and
the magnetic reduction gear mechanism includes a stator, and a high-speed rotor and a low-speed rotor provided coaxially to the stator.

12. The stage as claimed in claim 2, wherein
the support frame includes a pair of sidewalls, and a connecting wall connecting between the pair of sidewalls, in the direction perpendicular to the raising and lowering direction, so that the support frame forms an H-shape in a plan view, and
the four movable bodies, the four driving motors, and the four guides are disposed between the pair of sidewalls.

13. The stage as claimed in claim 2, wherein the four movable bodies include horizontally extending portions connected to the four driving motors, respectively, and vertically extending portions, extending in a direction perpendicular to a direction in which the horizontally extending portions extend, and guided by the four guides, respectively.

14. The stage as claimed in claim 2, wherein the four driving motors are direct driving motors, respectively.

15. The stage as claimed in claim 2, further comprising:
a magnetic decelerator configured to magnetically reduce a rotational motion of a driving motor, provided in the four driving motors themselves or between the four movable bodies and the four driving motors, respectively.

16. A testing apparatus comprising:
a stage of configured to transport a substrate placed thereon, wherein
the testing apparatus tests electrical characteristics of the substrate that is transported by pressing probes against the substrate, and
the stage includes
a base,
four movable bodies configured to support the base in a manner so that the base can be raised and lowered;
four driving motors, provided in correspondence with the four movable bodies, and configured to independently raise and lower the four movable bodies, respectively,
four guides configured to guide the four movable bodies, respectively, and
a support frame, having wall surfaces parallel to a raising and lowering direction of the base and continuous along a direction perpendicular to the raising and lowering direction of the base, and the four guides fixed to the wall surfaces.

17. A stage operating method comprising:
transporting a base; and
raising and lowering the base by four movable bodies provided in four driving motors, respectively, by independently driving the four driving motors,
wherein the raising and lowering the base guides raising and lowering of the four movable bodies by four guides fixed to wall surfaces of a support frame, and the wall surfaces are parallel to a raising and lowering direction of the base and continuous along a direction perpendicular to the raising and lowering direction of the base.

\* \* \* \* \*